United States Patent
Choi et al.

(10) Patent No.: US 10,073,491 B2
(45) Date of Patent: Sep. 11, 2018

(54) ROLLABLE DISPLAY DEVICE AND ELECTRONIC DEVICE INCLUDING THE SAME

(71) Applicant: SAMSUNG DISPLAY CO., LTD., Yongin-si, Gyeonggi-do (KR)

(72) Inventors: Jin-Hwan Choi, Seoul (KR); Young-Seok Seo, Seoul (KR); Tae-An Seo, Hwaseong-si (KR); Jung-Hun Lee, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/623,748

(22) Filed: Jun. 15, 2017

(65) Prior Publication Data

US 2018/0011510 A1 Jan. 11, 2018

(30) Foreign Application Priority Data

Jul. 5, 2016 (KR) ........................ 10-2016-0084717

(51) Int. Cl.
*G06F 1/16* (2006.01)
*H05K 1/02* (2006.01)
*H01L 51/00* (2006.01)
*G02F 1/1333* (2006.01)

(52) U.S. Cl.
CPC ........... *G06F 1/1601* (2013.01); *H05K 1/028* (2013.01); *G02F 1/133305* (2013.01); *H01L 51/0097* (2013.01)

(58) Field of Classification Search
None
See application file for complete search history.

(56) References Cited

U.S. PATENT DOCUMENTS

| | | | |
|---|---|---|---|
| 7,209,114 B2 * | 4/2007 | Radley-Smith | A44C 5/0007 345/156 |
| 7,710,370 B2 | 5/2010 | Slikkerveer et al. | |
| 8,289,232 B2 * | 10/2012 | Kobayashi | G09F 9/33 345/204 |

(Continued)

FOREIGN PATENT DOCUMENTS

WO    WO 2004/047059 A1    6/2004

OTHER PUBLICATIONS

European Search Report dated Nov. 21, 2017 in the corresponding European Patent Application No. 17179245.0.
U.S. Appl. No. 15/638,485, filed Jun. 30, 2017.

*Primary Examiner* — Xanthia C Cunningham
(74) *Attorney, Agent, or Firm* — Lee & Morse, P.C.

(57) ABSTRACT

A rollable display device includes a rollable structure including a plurality of unit structures, a display panel structure attached to the rollable structure, and a plurality of magnetic objects on a bezel region of the rollable structure, wherein respective widths of the unit structures increase in a direction from a first side of the rollable structure to a second side of the rollable structure, wherein the unit structures collectively form first through (n)th rolling cycles, as the rollable structure is rolled, and a (k)th rolling cycle encircles a (k−1)th rolling cycle, and wherein the plurality of magnetic objects aligns the (k)th rolling cycle with the (k−1)th rolling cycle by causing a magnetic attraction between the (k)th rolling cycle and the (k−1)th rolling cycle.

20 Claims, 11 Drawing Sheets

(56) References Cited

U.S. PATENT DOCUMENTS

| | | | | |
|---|---|---|---|---|
| 8,344,836 B2* | 1/2013 | Lauder | ................... | H01F 7/04 |
| | | | | 206/320 |
| 2011/0043976 A1 | 2/2011 | Visser et al. | | |
| 2011/0227822 A1 | 9/2011 | Shai | | |
| 2013/0154970 A1* | 6/2013 | Seo | ................... | G06F 3/0488 |
| | | | | 345/173 |
| 2014/0321073 A1 | 10/2014 | Hong et al. | | |
| 2015/0227245 A1* | 8/2015 | Inagaki | ................ | G06F 3/0412 |
| | | | | 345/173 |
| 2015/0313004 A1* | 10/2015 | Namkung | ............ | G06F 1/1652 |
| | | | | 361/749 |
| 2015/0325804 A1* | 11/2015 | Lindblad | ............... | H01L 51/52 |
| | | | | 313/511 |
| 2016/0231843 A1* | 8/2016 | Kim | ................... | G06F 3/0412 |
| 2016/0323993 A1* | 11/2016 | Kwon | ............... | G02F 1/133305 |
| 2016/0327987 A1* | 11/2016 | Huitema | ............... | G06F 1/1652 |
| 2017/0064845 A1* | 3/2017 | Jung | ................... | H05K 1/028 |

* cited by examiner

ROLLABLE DISPLAY DEVICE AND ELECTRONIC DEVICE INCLUDING THE SAME

CROSS-REFERENCE TO RELATED APPLICATION

Korean Patent Application No. 10-2016-0084717, filed on Jul. 5, 2016, in the Korean Intellectual Property Office, and entitled: "Rollable Display Device and Electronic Device Including the Same," is incorporated by reference herein in its entirety.

BACKGROUND

1. Field

Example embodiments relate generally to an electronic device. More particularly, embodiments relate to a rollable display device that can be rolled and unrolled by a user and an electronic device including the rollable display device.

2. Description of the Related Art

Recently, consumers attribute greater importance to design of an electronic device when purchasing the electronic device. Further, consumers want an electronic device that can provide a user (e.g., a viewer) with a relatively large image while having portability. Accordingly, a rollable display device is spotlighted as a display device that is included in an electronic device.

Generally, a rollable display device is rolled to achieve a relatively small size when carried, and is unrolled to provide relatively large images to a user when used. To this end, the rollable display device includes a rollable structure and a display panel structure that is attached to the rollable structure. Here, the display panel structure is rolled when the rollable structure is rolled by the user, while the display panel structure is unrolled when the rollable structure is unrolled by the user. In the rollable display device, a plurality of rolling cycles is formed as the rollable structure is rolled.

SUMMARY

According to an aspect of example embodiments, a rollable display device may include a rollable structure including a plurality of unit structures, the rollable structure being configured to be rolled and unrolled based on the unit structures, and a display panel structure attached to the rollable structure. Here, respective widths of the unit structures may increase in a direction from a first side of the rollable structure to a second side of the rollable structure, the first side of the rollable structure being opposite to the second side of the rollable structure. In addition, the unit structures may collectively form (i.e., constitute) first through (n)th rolling cycles, where n is an integer grater than or equal to 2, as the rollable structure is rolled, and a (k)th rolling cycle may encircle a (k−1)th rolling cycle, where k is an integer between 2 and n. Further, a plurality of magnetic objects that aligns the (k)th rolling cycle with the (k−1)th rolling cycle by causing a magnetic attraction between the (k)th rolling cycle and the (k−1)th rolling cycle may be attached to a bezel region of the rollable structure.

In example embodiments, a first surface of the (k)th rolling cycle may face a second surface of the (k−1)th rolling cycle, a first polarity of first magnetic objects attached to the first surface of the (k)th rolling cycle may be exposed, and a second polarity of second magnetic objects attached to the second surface of the (k−1)th rolling cycle may be exposed, the first polarity being opposite to the second polarity.

In example embodiments, the first magnetic objects may have a first thickness, the second magnetic objects may have a second thickness, and a space corresponding to a value generated by summing the first thickness and the second thickness may be secured between the (k)th rolling cycle and the (k−1)th rolling cycle.

In example embodiments, a first surface of the (k)th rolling cycle may face a second surface of the (k−1)th rolling cycle, the magnetic objects may be attached to the second surface of the (k−1)th rolling cycle, and metal objects may be attached to the first surface of the (k)th rolling cycle, the metal objects being able to stick to the magnetic objects.

In example embodiments, the magnetic objects may have a first thickness, the metal objects may have a second thickness, and a space corresponding to a value generated by summing the first thickness and the second thickness may be secured between the (k)th rolling cycle and the (k−1)th rolling cycle.

In example embodiments, the magnetic objects may be permanent magnets.

In example embodiments, the magnetic objects may be electromagnets.

In example embodiments, the magnetic objects may be attached to all of the unit structures included in the rollable structure.

In example embodiments, the magnetic objects may be attached to some of the unit structures included in the rollable structure.

In example embodiments, an angle between adjacent ones of the unit structures may be maintained to be greater than or equal to a reference angle in each of the first through (n)th rolling cycles.

In example embodiments, the rollable structure may further include a circuit structure that is adjacent to the second side of the rollable structure, a driving integrated circuit that drives the display panel structure may be located within the circuit structure, and a thickness of the circuit structure may be thinner than respective thicknesses of the unit structures.

According to an aspect of example embodiments, an electronic device may include a rollable display device, a rolling detection sensor configured to generate a rolling detection signal indicating whether the rollable display device is rolled or unrolled, and a processor configured to control a displaying operation of the rollable display device based on the rolling detection signal. The rollable display device may include a rollable structure including a plurality of unit structures, the rollable structure being configured to be rolled and unrolled based on the unit structures, and a display panel structure attached to the rollable structure. Here, respective widths of the unit structures may increase in a direction from a first side of the rollable structure to a second side of the rollable structure, the first side of the rollable structure being opposite to the second side of the rollable structure. In addition, the unit structures may collectively form first through (n)th rolling cycles, where n is an integer grater than or equal to 2, as the rollable structure is rolled, and a (k)th rolling cycle may encircle a (k−1)th rolling cycle, where k is an integer between 2 and n. Further, a plurality of magnetic objects that aligns the (k)th rolling cycle with the (k−1)th rolling cycle by causing a magnetic attraction between the (k)th rolling cycle and the (k−1)th rolling cycle may be attached to a bezel region of the rollable structure.

In example embodiments, a first surface of the (k)th rolling cycle may face a second surface of the (k−1)th rolling cycle, a first polarity of first magnetic objects attached to the first surface of the (k)th rolling cycle may be exposed, and a second polarity of second magnetic objects attached to the second surface of the (k−1)th rolling cycle may be exposed, the first polarity being opposite to the second polarity.

In example embodiments, the first magnetic objects may have a first thickness, the second magnetic objects may have a second thickness, and a space corresponding to a value generated by summing the first thickness and the second thickness may be secured between the (k)th rolling cycle and the (k−1)th rolling cycle.

In example embodiments, a first surface of the (k)th rolling cycle may face a second surface of the (k−1)th rolling cycle, the magnetic objects may be attached to the second surface of the (k−1)th rolling cycle, and metal objects may be attached to the first surface of the (k)th rolling cycle, the metal objects being able to stick to the magnetic objects.

In example embodiments, the magnetic objects may have a first thickness, the metal objects may have a second thickness, and a space corresponding to a value generated by summing the first thickness and the second thickness may be secured between the (k)th rolling cycle and the (k−1)th rolling cycle.

In example embodiments, the magnetic objects may be permanent magnets.

In example embodiments, the magnetic objects may be electromagnets.

In example embodiments, the magnetic objects may be attached to all of the unit structures included in the rollable structure.

In example embodiments, the magnetic objects may be attached to some of the unit structures included in the rollable structure.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
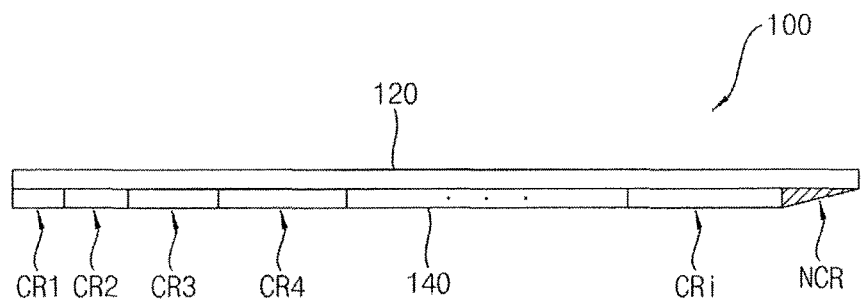
FIG. 1 illustrates a diagram of a rollable display device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, embodiments will be explained in detail with reference to the accompanying drawings.

Figure 2:
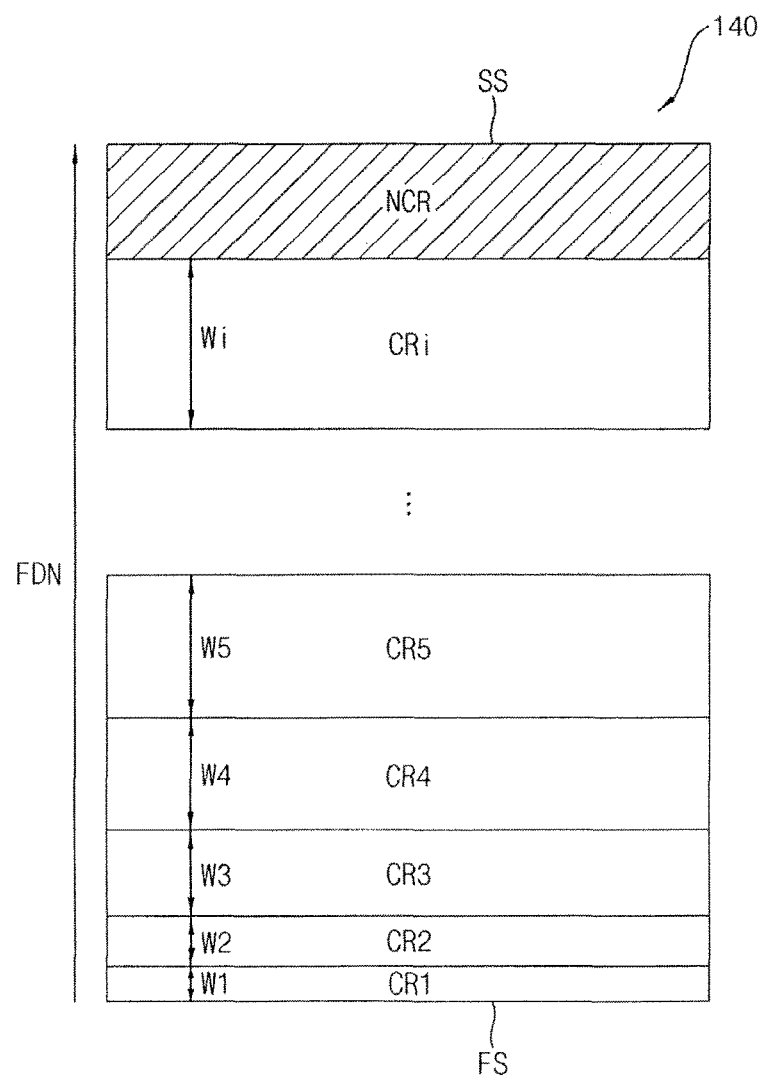
FIG. 2 illustrates a plan view of a rollable structure included in the rollable display device of FIG. 1.
Figure 3:
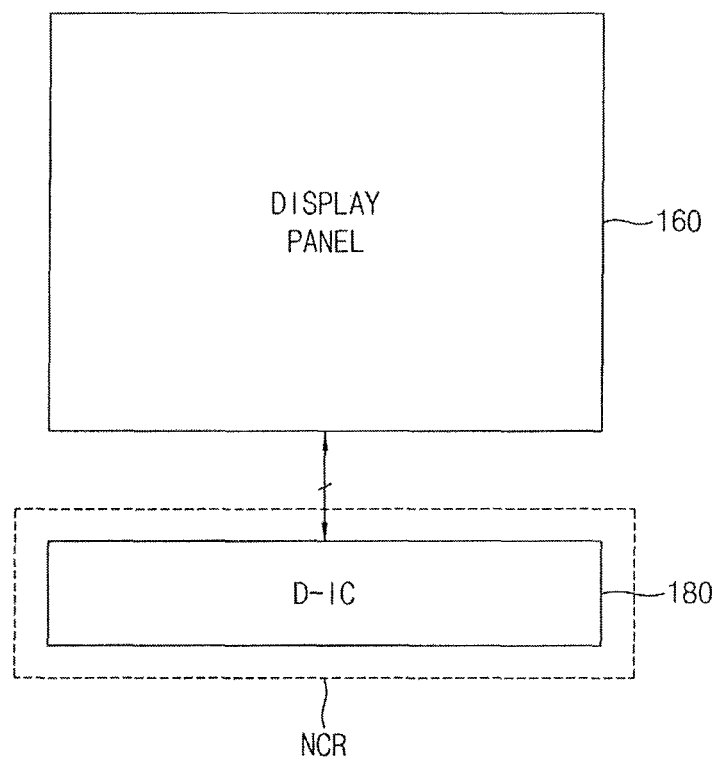
FIG. 3 illustrates a block diagram of a displaying operation of the rollable display device of FIG. 1.

FIG. 1 is a diagram illustrating a rollable display device according to example embodiments. FIG. 2 is a plan view illustrating a rollable structure included in the rollable display device of FIG. 1. FIG. 3 is a block diagram for describing a displaying operation of the rollable display device of FIG. 1.

Referring to FIGS. 1 through 3, the rollable display device 100 may include a display panel structure 120 and a rollable structure 140. In an example embodiment, the rollable display device 100 may further include a driving integrated circuit 180 that drives the display panel structure 120. As illustrated in FIG. 3, the display panel structure 120 and the rollable structure 140 may constitute a display panel 160.

In an example embodiment, the rollable structure 140 may further include a circuit structure NCR that is adjacent to a second side SS of the rollable structure 140, and the driving integrated circuit 180 may be located in the circuit structure NCR of the rollable structure 140. In some example embodiments, the driving integrated circuit 180 may be located outside the rollable display device 100, and thus the circuit structure NCR may be omitted from the rollable structure 140. In an example embodiment, the rollable structure 140 may further include a dummy structure that is adjacent to a first side FS of the rollable structure 140. The dummy structure of the rollable structure 140 may be prepared to provide a region of the rollable display device 100 that a user can grab (i.e., for user convenience) or to protect the rollable display device 100 from external shocks. Thus, the display panel structure 120 may not be located on the dummy structure of the rollable structure 140. In some example embodiments, when the rollable structure 140 does not include the circuit structure NCR, the rollable structure 140 may further include the dummy structure instead of the circuit structure NCR.

The display panel structure 120 may be attached to the rollable structure 140. Here, since the display panel structure 120 is manufactured with flexible materials, the display panel structure 120 may be rolled and unrolled as the rollable structure 140 is rolled and unrolled. The display panel structure 120 may include a plurality of pixels. In an example embodiment, the pixels may include red color emission pixels, green color emission pixels, and blue color emission pixels. In another example embodiment, the pixels may include red color emission pixels, green color emission pixels, blue color emission pixels, and white color emission pixels. Thus, the display panel structure 120 may display an image using the pixels.

In an example embodiment, the rollable display device 100 may be an organic light emitting diode (OLED) display device. In this case, the display panel structure 120 may include an organic light emitting structure including organic light emitting diodes. In another example embodiment, the rollable display device 100 may be a liquid crystal display (LCD) device. In this case, the display panel structure 120 may include a liquid crystal structure including liquid crystals. However, the rollable display device 100 is not limited thereto.

The rollable structure 140 may include a plurality of unit structures CR1 through CRi, and thus the rollable structure 140 may be rolled and unrolled based on the unit structures CR1 through CRi (e.g., the shape, structure, and configuration of the rollable structure 140, when rolled, may be determined by the shapes, sizes, and configurations of the unit structures CR1 through CRi). Here, respective widths W1 through Wi of the unit structures CR1 through CRi may incrementally increase in a direction from the first side FS of the rollable structure 140 to the second side SS of the rollable structure 140, the second side SS of the rollable structure 140 being opposite to the first side FS of the rollable structure 140.

For example, the width W2 of the second unit structure CR2 may be greater than the width W1 of the first unit structure CR1 that is closest to the first side FS of the rollable structure 140, the width W3 of the third unit structure CR3 may be greater than the width W2 of the second unit structure CR2, and the width W4 of the fourth unit structure CR4 may be greater than the width W3 of the third unit structure CR3. Thus, the display panel structure 120 may not be damaged or separated from the rollable structure 140 when the rollable structure 140 is rolled in a first direction FDN. In example embodiments, an angle between adjacent ones of the unit structures CR1 through CRi may be maintained to be greater than or equal to a reference angle.

As the rollable structure 140, to which the display panel structure 120 is attached, is rolled, the unit structures CR1 through CRi may collectively form first through (n)th rolling cycles, where n is an integer greater than or equal to 2. Here, the (k)th rolling cycle may encircle the (k−1)th rolling cycle, where k is an integer between 2 and n. That is, the unit structures CR1 through CRi may sequentially constitute the first through (n)th rolling cycles as the rollable structure 140, to which the display panel structure 120 is attached, is rolled.

If a sufficient space between the first through (n)th rolling cycles is not secured, the display panel structure 120 attached to the rollable structure 140 may be damaged (e.g., scratch, crack, etc.) or deteriorated (e.g., deterioration due to misalignment) by a collision between the first through (n)th rolling cycles. For example, because the unit structures CR1 through CRi sequentially constitute the first through fourth rolling cycles as the rollable structure 140 is rolled in the first direction FDN, the second rolling cycle may encircle the first rolling cycle, the third rolling cycle may encircle the second rolling cycle, and the fourth rolling cycle may encircle the third rolling cycle. However, if insufficient space is provided between adjacent rolling cycles of first through (n)th rolling cycles, the first rolling cycle may collide with the second rolling cycle that encircles the first rolling cycle, the second rolling cycle may collide with the third rolling cycle that encircles the second rolling cycle, and the third rolling cycle may collide with the fourth rolling cycle that encircles the third rolling cycle.

Therefore, according to example embodiments, magnetic objects, e.g., aligners, for securing a sufficient space between the (k)th rolling cycle and the (k−1)th rolling cycle may be attached to a bezel region of the rollable structure 140, where the magnetic objects align the (k)th rolling cycle with the (k−1)th rolling cycle by generating a magnetic attraction between the (k)th rolling cycle and the (k−1)th rolling cycle. For example, the magnetic objects may be permanent magnets that maintain magnetic force constantly.

In another example, the magnetic objects may be electromagnets, i.e., the magnetic objects may exhibit magnetic force when a current flows through the magnetic objects. That is, the magnetic objects (i.e., the electromagnets) may lose the magnetic force when no current flows through the magnetic objects. Therefore, when the magnetic objects attached to the bezel region of the rollable structure 140 are implemented by the electromagnets, a user may control the magnetic objects to have the magnetic force when needed. For example, when the user unrolls the rollable display device 100 to use the rollable display device 100, the user may control the magnetic objects not to have the magnetic force. On the other hand, when the user rolls the rollable display device 100 to carry the rollable display device 100, the user may control the magnetic objects to have the magnetic force.

In an example embodiment, when a first surface of the (k)th rolling cycle faces a second surface of the (k−1)th rolling cycle, a first polarity (e.g., north pole N or south pole S) of first magnetic objects attached to the first surface of the (k)th rolling cycle may be exposed, and a second polarity (e.g., south pole S or north pole N), which is opposite to the first polarity, of second magnetic objects attached to the second surface of the (k−1)th rolling cycle may be exposed. Thus, as the rollable structure 140, to which the display panel structure 120 is attached, is rolled, magnetic force (i.e., magnetic attraction) may be caused between the first magnetic objects attached to the first surface of the (k)th rolling cycle and the second magnetic objects attached to the second surface of the (k−1)th rolling cycle, and thus the (k)th rolling cycle may be aligned with the (k−1)th rolling cycle by magnetic attachment of the first magnetic objects and the second magnetic objects.

In addition, when the first magnetic objects attached to the first surface of the (k)th rolling cycle have a first thickness and the second magnetic objects attached to the second surface of the (k−1)th rolling cycle have a second thickness, a space corresponding to a value generated by summing the first thickness and the second thickness may be secured between the (k)th rolling cycle and the (k−1)th rolling cycle. That is, because a sufficient space is secured between the (k)th rolling cycle and the (k−1)th rolling cycle, collision between the (k)th rolling cycle and the (k−1)th rolling cycle may be prevented.

In another example embodiment, when the first surface of the (k)th rolling cycle faces the second surface of the (k−1)th rolling cycle, magnetic objects may be attached to the second surface of the (k−1)th rolling cycle, and metal objects may be attached to the first surface of the (k)th rolling cycle, i.e., the metal objects may include metal that can stick to the magnetic objects. Thus, as the rollable structure 140, to which the display panel structure 120 is attached, is rolled, magnetic force (i.e., magnetic attraction) may be caused between the metal objects attached to the first surface of the (k)th rolling cycle and the magnetic objects attached to the second surface of the (k−1)th rolling cycle, and thus the (k)th rolling cycle may be aligned with the (k−1)th rolling cycle by magnetic attachment of the magnetic objects and the metal objects.

In addition, when the magnetic objects attached to the second surface of the (k−1)th rolling cycle have a first thickness and the metal objects attached to the first surface of the (k)th rolling cycle have a second thickness, a space corresponding to a value generated by summing the first thickness and the second thickness may be secured between the (k)th rolling cycle and the (k−1)th rolling cycle. That is, because a sufficient space is secured between the (k)th rolling cycle and the (k−1)th rolling cycle, collision between the (k)th rolling cycle and the (k−1)th rolling cycle may be prevented.

In an example embodiment, the magnetic objects attached to the bezel region of the rollable structure 140 may be attached to all unit structures CR1 through CRi included in the rollable structure 140. That is, at least one magnetic object may be attached to each of the unit structures CR1 through CRi included in the rollable structure 140. In another example embodiment, the magnetic objects attached to the bezel region of the rollable structure 140 may be attached to some of the unit structures CR1 through CRi included in the rollable structure 140.

As described above, the rollable structure 140 may include the circuit structure NCR that is adjacent to the second side SS of the rollable structure 140. In this case, a chip-on flexible (COF) printed circuit board, a flexible printed circuit board (FPCB), a power connector, etc., as well as the driving integrated circuit 180, may be included in the circuit structure NCR of the rollable structure 140. In an example embodiment, as illustrated in FIG. 1, a thickness of the circuit structure NCR of the rollable structure 140 may be thinner than respective thicknesses of the unit structures CR1 through CRi of the rollable structure 140. As illustrated in FIG. 3, the driving integrated circuit 180 may drive the display panel 160, which the display panel structure 120 and the rollable structure 140 constitute. For this operation, the driving integrated circuit 180 may include a scan driver, a data driver, a timing controller, etc. The display panel 160 may be connected to the driving integrated circuit 180 via scan-lines and data-lines. The scan driver may provide a scan signal to the display panel 160 via the scan-lines. The data driver may provide a data signal to the display panel 160 via the data-lines. The timing controller may control the scan driver, the data driver, etc. However, components included in the driving integrated circuit 180 are not limited thereto. For example, the driving integrated circuit 180 may further include a power supply that supplies power to the display panel 160.

As discussed previously, the rollable display device 100 may include the display panel structure 120 and the rollable structure 140. Here, the rollable display device 100 may include, e.g., gradually, increased respective widths W1 through Wi of the unit structures CR1 through CRi in the first direction FDN, i.e., a direction from the first side FS of the rollable structure 140 to the second side SS of the rollable structure 140. Thus, the rollable display device 100 may prevent a stress from being applied to the display panel structure 120 when the rollable structure 140 is rolled and unrolled by the user, and thus may prevent the display panel structure 120 from being damaged or separated from the rollable structure 140. That is, in the rollable display device 100, since respective widths W1 through Wi of the unit structures CR1 through CRi increase in the direction from the first side FS of the rollable structure 140 to the second side SS of the rollable structure 140, a stress accumulated from an inner rolling cycle to an outer rolling cycle may be alleviated, and thus a severe stress may not be applied to the display panel structure 120.

In addition, the rollable display device 100 may prevent the display panel structure 120 attached to the rollable structure 140 from being damaged or deteriorated by collision between the rolling cycles, where the unit structures CR1 through CRi collectively form the rolling cycles as the rollable structure 140 is rolled, by aligning the rolling cycles using magnetic objects attached to the bezel region of the rollable structure 140 when the rollable structure 140 is rolled based on the unit structures CR1 through CRi included in the rollable structure 140 to secure sufficient space between the rolling cycles when the rollable structure 140 is rolled based on the unit structures CR1 through CRi included in the rollable structure 140. In example embodiments, since magnetic force (i.e., magnetic attraction) is caused between the rolling cycles when the rollable display device 100 is completely rolled, a rolled state of the rollable display device 100 may be maintained until the user unrolls the rollable display device 100.

Figure 4:
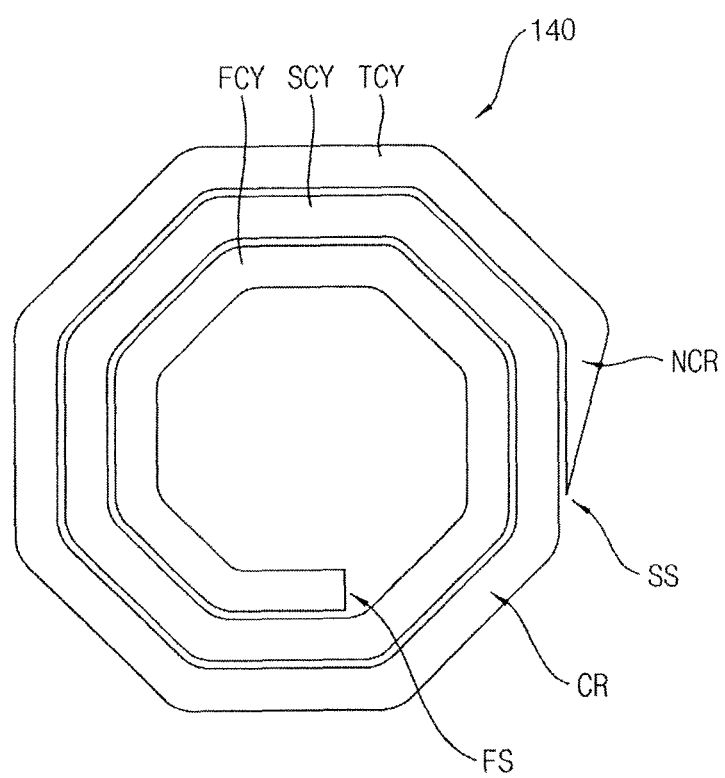
FIG. 4 illustrates a diagram of an example in which the rollable display device of FIG. 1 is completely rolled.
Figure 5:
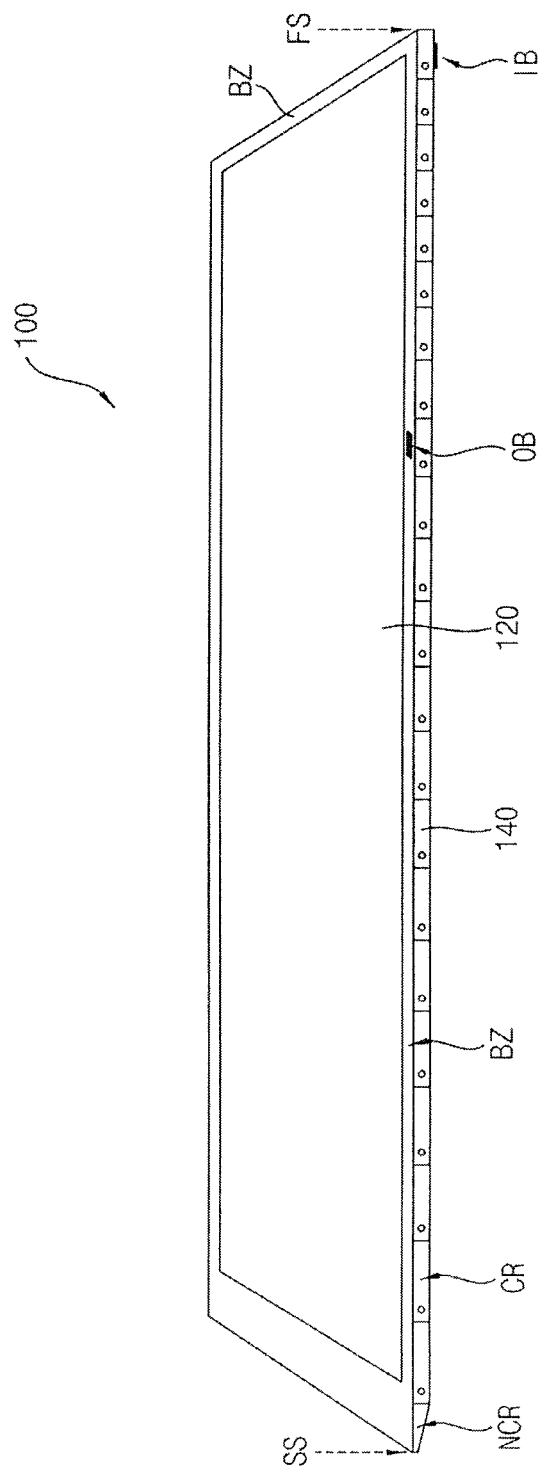
FIG. 5 illustrates a diagram of an example in which the rollable display device of FIG. 1 is completely unrolled.

FIG. 4 is a schematic diagram illustrating an example in which the rollable display device 100 is completely rolled. FIG. 5 is a perspective view of the rollable display device 100 when it is completely unrolled.

In detail, referring to FIGS. 4 and 5, the rollable display device may include the rollable structure 140 and the display panel structure 120. The display panel structure 120 may be attached to the rollable structure 140. The rollable structure 140 may include the plurality of unit structures CR. The rollable structure 140 may be rolled or unrolled based on the unit structures CR.

As illustrated in FIG. 5, respective widths of the unit structures CR may increase in a direction from the first side FS of the rollable structure 140 to the second side SS of the rollable structure 140, where the second side SS of the rollable structure 140 is opposite to the first side FS of the rollable structure 140. For example, as further illustrated in FIG. 5, when the unit structures CR of the rollable structure 140 are unrolled to define a flat upper surface, the display panel structure 120 may be unrolled on the defined flat surface to display an image. The rollable structure 140 may further include the circuit structure NCR that is adjacent to the second side SS of the rollable structure 140, e.g., at a left side of the display panel structure 120 in FIG. 5.

As further illustrated in FIG. 5, a peripheral region of the display panel structure 120 attached to the rollable structure 140 (i.e., a region surrounding the display panel structure 120) may be a bezel region BZ of the rollable structure 140. For example, a peripheral portion of the rollable structure 140 not overlapped by the display panel structure 120 and, e.g., completely, surrounding the display panel structure 120 may be the bezel region BZ.

As described above, as the rollable structure 140 is rolled, the unit structures CR of the rollable structure 140 may collectively form first through (n)th rolling cycles, with a (k)th rolling cycle may encircle a (k−1)th rolling cycle. For example, referring to FIGS. 4-5, the unit structures CR (FIG. 5) may be collectively rolled to form first through third rolling cycles FCY, SCY, and TCY (FIG. 4), with the display panel structure 120 being on a surface of the rollable structure 140 facing an interior of the rolled structure. Here, the second rolling cycle SCY may encircle the first rolling cycle FCY, and the third rolling cycle TCY may encircle the second rolling cycle SCY.

Thus, in order to prevent a collision between the first through third rolling cycles FCY, SCY, and TCY, magnetic objects OB and IB may be attached to the bezel region BZ of the rollable structure 140, as will be described in more detail with reference to FIGS. 8A-8B below. The magnetic objects may align the (k)th rolling cycle with the (k−1)th rolling cycle by causing a magnetic attraction between the (k)th rolling cycle and the (k−1)th rolling cycle. Thus, the rollable structure 140 may secure a sufficient space between the (k)th rolling cycle and the (k−1)th rolling cycle.

In an example embodiment, the magnetic objects OB/IB attached to the bezel region BZ of the rollable structure 140 may be permanent magnets. In this case, the magnetic objects attached to the bezel region BZ of the rollable structure 140 may maintain a magnetic force. In another example embodiment, the magnetic objects attached to the bezel region BZ of the rollable structure 140 may be electromagnets. In this case, the magnetic objects attached to the bezel region BZ of the rollable structure 140 may have the magnetic force when a current flows through the magnetic objects. That is, the magnetic objects attached to the bezel region BZ of the rollable structure 140 may lose the magnetic force when no current flows through the magnetic objects.

As described above, since the magnetic objects are attached to the bezel region BZ of the rollable structure 140, the rollable display device 100 may be easily rolled by the magnetic force of the magnetic objects when a user tries to roll the rollable display device 100 to carry the rollable display device 100. In addition, when the rollable display device 100 is completely rolled, a rolled state of the rollable display device 100 may be maintained by the magnetic force of the magnetic objects until the user unrolls the rollable display device 100. In example embodiments, the magnetic objects attached to the bezel region BZ of the rollable structure 140 may be attached to all or some of the unit structures CR included in the rollable structure 140. These embodiments will be described in detail with reference to FIGS. 6 through 8B.

Figure 6:
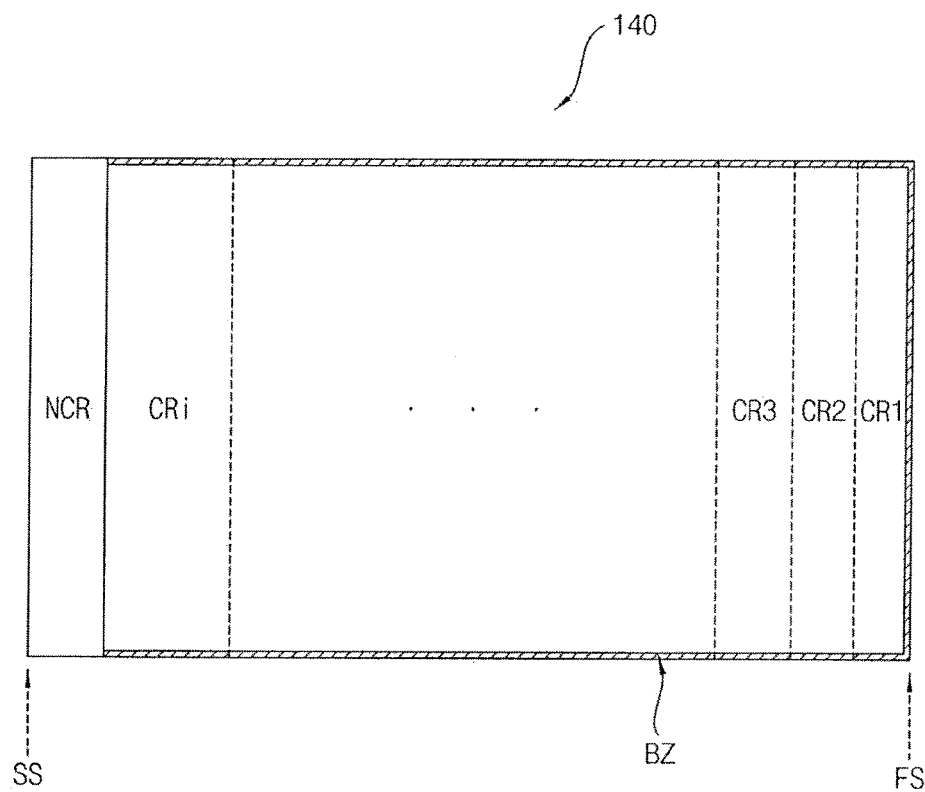
FIG. 6 illustrates a plan view of an example in which a rollable structure included in the rollable display device of FIG. 1 is completely unrolled.
Figure 7:
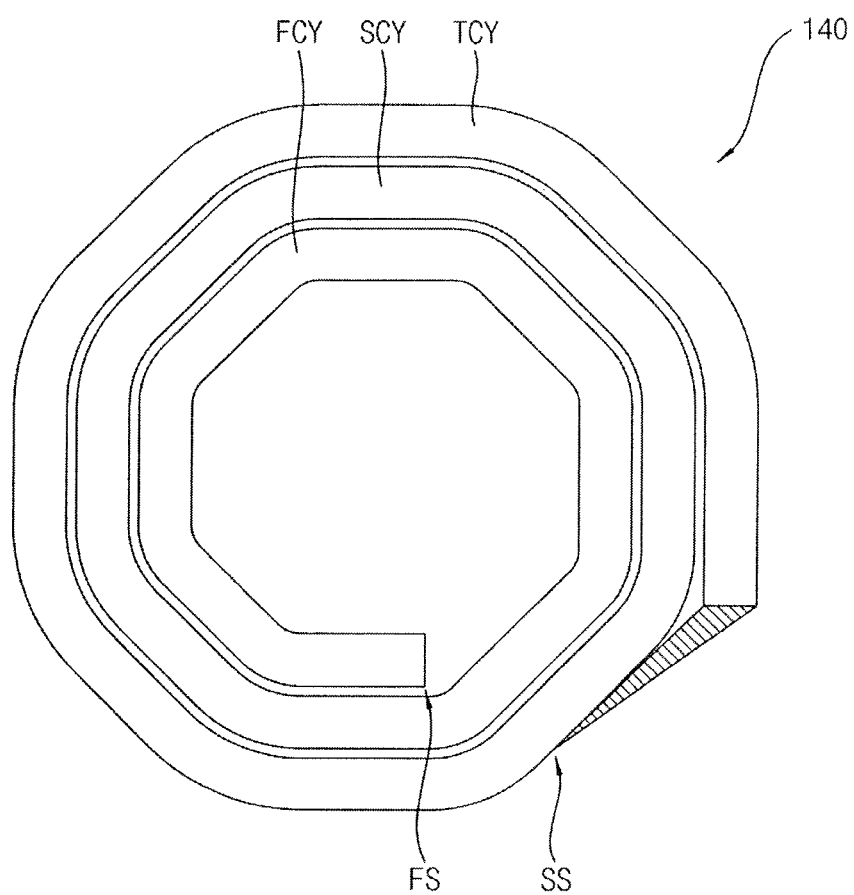
FIG. 7 illustrates a lateral view of an example in which a rollable structure included in the rollable display device of FIG. 1 is completely rolled.

FIG. 6 is a plan view illustrating an example of the rollable structure 140 in a completely unrolled state. FIG. 7 is a lateral view illustrating the rollable structure 140 in a completely rolled state. FIG. 8A is a lateral view illustrating magnetic objects attached to a bezel region of the rollable structure 140 according to example embodiments. FIG. 8B is a lateral view illustrating magnetic objects attached to a bezel region of the rollable structure 140 according to other example embodiments.

Referring to FIGS. 6 through 8B, the rollable structure 140 may include the plurality of unit structures CR1 through CRi. The rollable structure 140 may be rolled or unrolled based on the unit structures CR1 through CRi. Here, respective widths of the unit structures CR1 through CRi may increase in a direction from a first side FS of the rollable structure 140 to a second side SS of the rollable structure 140, where the first side FS of the rollable structure 140 is opposite to the second side SS of the rollable structure 140. The display panel structure 120 may be attached to the rollable structure 140, as illustrated in FIG. 5. As illustrated in FIG. 6, the peripheral region of the display panel structure (i.e., the hatched area in FIG. 6 surrounding a region of a display panel structure) may be the bezel region BZ of the rollable structure 140.

Figure 8A:
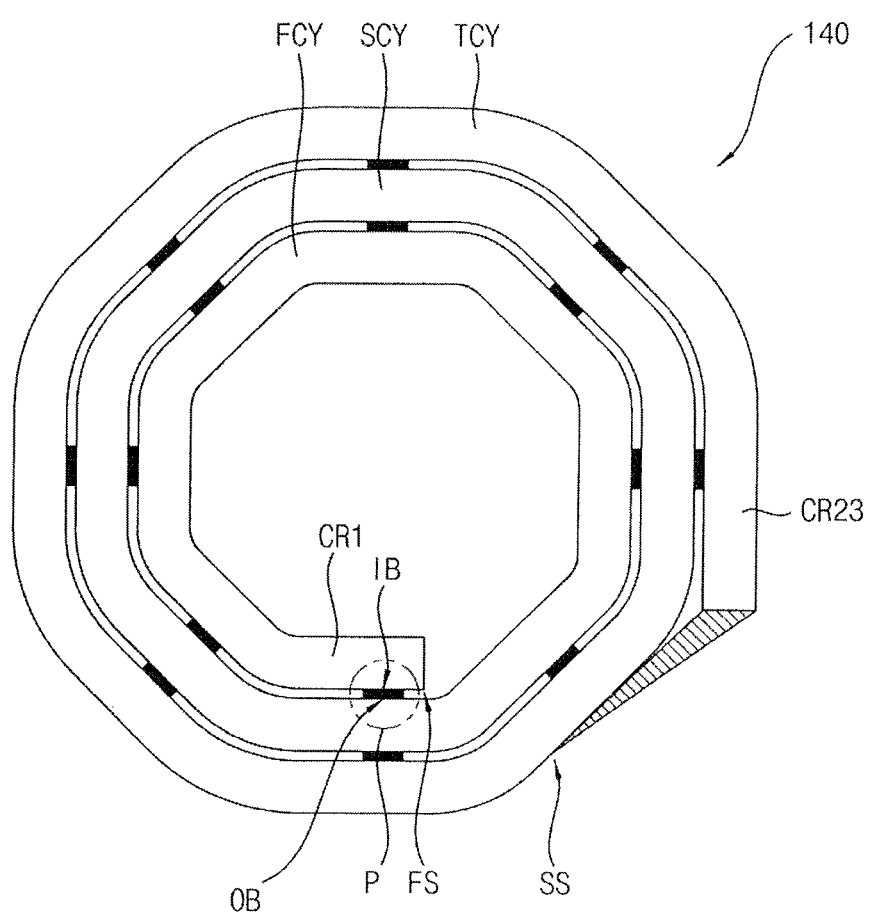
FIG. 8A illustrates a lateral view of an example in which magnetic objects are attached to a bezel region of a rollable structure included in the rollable display device of FIG. 1.

Referring to FIG. 8A, the magnetic objects IB and OB may be attached to the bezel region BZ of the rollable structure 140. For example, a first width of each of the magnetic objects IB and OB may be smaller than a width of a respective unit structure in the first direction FDN, and a second width of each of the magnetic objects IB and OB may be equal to or smaller than a width of the bezel region BZ in a direction crossing the first direction FDN. The magnetic objects IB and OB may be attached to an upper surface and/or a lower surface of the bezel region BZ of the unit structures CR1 through CRi included in the rollable structure 140. For example, as illustrated in FIG. 7, the unit structures CR1 through CRi may collectively form the first through third rolling cycles FCY, SCY, and TCY as the rollable structure 140 is rolled. Here, the second rolling cycle SCY may encircle the first rolling cycle FCY, and the third rolling cycle TCY may encircle the second rolling cycle SCY. Thus, the magnetic objects IB and OB attached to the bezel region BZ of the rollable structure 140 may align the first rolling cycle FCY with the second rolling cycle SCY by causing a magnetic attraction between the first rolling cycle FCY and the second rolling cycle SCY, and may align the second rolling cycle SCY with the third rolling cycle TCY by causing a magnetic attraction between the second rolling cycle SCY and the third rolling cycle TCY.

As a result, the magnetic objects IB and OB attached to the bezel region BZ of the rollable structure 140 may secure a sufficient space between the first rolling cycle FCY and the second rolling cycle SCY, and may secure a sufficient space between the second rolling cycle SCY and the third rolling cycle TCY. In detail, the magnetic objects IB and OB attached to the bezel region BZ of the rollable structure 140 may prevent the display panel structure attached to the rollable structure 140 from being damaged or deteriorated by performing alignments between the first through third rolling cycles FCY, SCY, and TCY to prevent a collision between the first through third rolling cycles FCY, SCY, and TCY.

In an example embodiment, the magnetic objects IB and OB attached to the bezel region BZ of the rollable structure 140 may be permanent magnets. In this case, the magnetic objects IB and OB attached to the bezel region BZ of the rollable structure 140 may maintain a magnetic force. In another example embodiment, the magnetic objects IB and OB attached to the bezel region BZ of the rollable structure 140 may be electromagnets. In this case, the magnetic objects IB and OB attached to the bezel region BZ of the rollable structure 140 may have the magnetic force when a current flows through the magnetic objects IB and OB. That is, the magnetic objects IB and OB attached to the bezel region BZ of the rollable structure 140 may lose the magnetic force when no current flows through the magnetic objects IB and OB. Hence, when the magnetic objects IB and OB attached to the bezel region BZ of the rollable structure 140 are implemented by the electromagnets, a user may control the magnetic objects IB and OB to have the magnetic force when needed.

In an example embodiment, as illustrated in FIG. 8A, the magnetic objects IB and OB attached to the bezel region BZ of the rollable structure 400 may be attached to all of the unit structures CR1 through CRi included in the rollable structure 400. That is, at least one of the magnetic objects IB and OB attached to the bezel region BZ of the rollable structure 400 may be attached to each of the unit structures CR1 through CRi included in the rollable structure 400.

For example, when the rollable structure 140 includes first through twenty-third unit structures CR, the first rolling cycle FCY may include first through eighth unit structures CR, the second rolling cycle SCY may include ninth through sixteenth unit structures CR, and the third rolling cycle TCY may include the seventeenth through twenty-third unit structures CR. Here, the magnetic objects IB and OB attached to the bezel region BZ of the rollable structure 400 may be attached to each one of the first through twenty-third unit structures CR1 through CR23 (FIG. 8A).

Figure 8B:
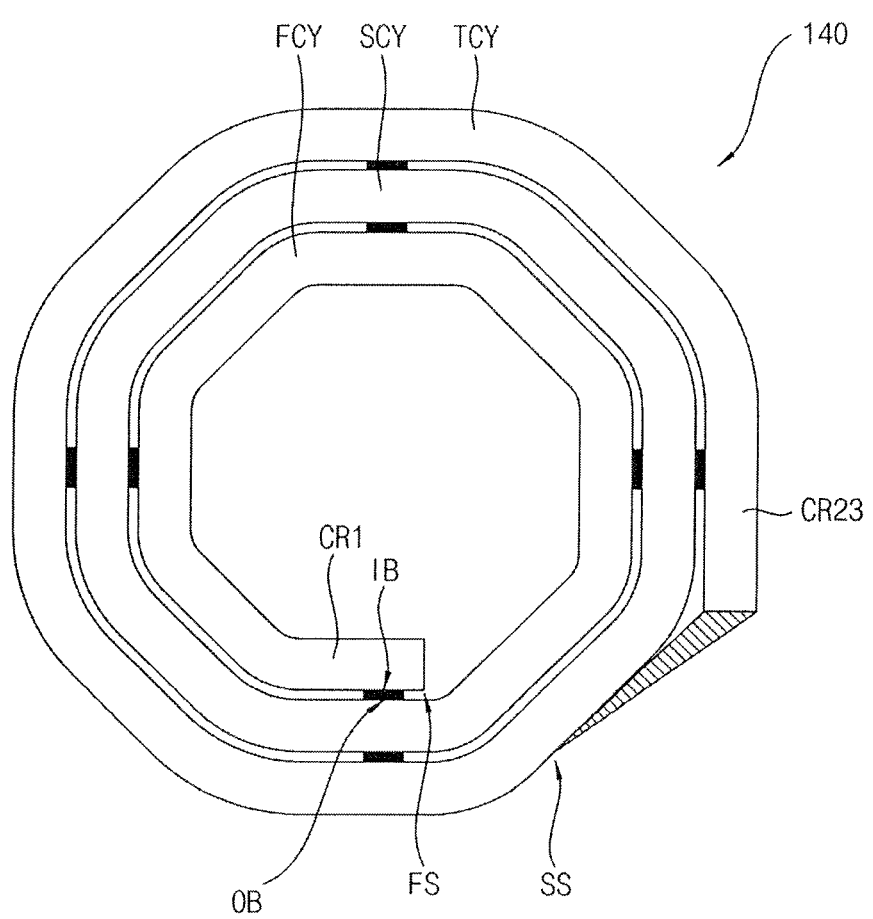
FIG. 8B illustrates a lateral view of another example in which magnetic objects are attached to a bezel region of a rollable structure included in the rollable display device of FIG. 1.

In another example, as illustrated in FIG. 8B, the magnetic objects IB and OB attached to the bezel region BZ of the rollable structure 140 may be attached to, e.g., only, some of the unit structures CR included in the rollable structure 140. For example, when the rollable structure 140 includes the first through twenty-third unit structures CR, the first rolling cycle FCY may include the first through eighth unit structures CR, the second rolling cycle SCY may include the ninth through sixteenth unit structures CR, and the third rolling cycle TCY may include the seventeenth through twenty-third unit structures CR. For example, as illustrated in FIG. 8B, the magnetic objects IB and OB attached to the bezel region BZ of the rollable structure 140 may be attached to only the odd numbered unit structures CR, i.e., to the first unit structure CR, the third unit structure CR, the fifth unit structure CR, the seventh unit structure CR, the ninth unit structure CR, the eleventh unit structure CR, the thirteenth unit structure CR, the fifteenth unit structure CR, the seventeenth unit structure CR, the nineteenth unit structure CR, the twenty-first unit structure CR, and the twenty-third unit structure CR. However, target unit structures to which the magnetic objects IB and OB are attached may be selected in various ways. Although the magnetic objects IB and OB are mentioned above, in some example embodiments, one of the magnetic objects IB and OB may be replaced with metal objects.

FIGS. 9A through 9E are diagrams illustrating various shapes of the magnetic objects OB and IB in the rollable structure 140. It is noted that each of FIGS. 9A through 9E is an enlarged view of portion P in FIG. 8A.

Referring to FIGS. 9A through 9E, when the rollable structure 140 is in a rolled state, a first surface of the (k)th rolling cycle (k)CY may face a second surface of the (k−1)th rolling cycle (k−1)CY. Here, the (k)th rolling cycle (k)CY may be aligned with the (k−1)th rolling cycle (k−1)CY by magnetic attachment of the magnetic objects OB and IB due to the magnetic force (i.e., the magnetic attraction) between the magnetic object OB attached to the first surface of the (k)th rolling cycle (k)CY and the magnetic object IB attached to the second surface of the (k−1)th rolling cycle (k−1)CY.

In an example embodiment, the magnetic object OB attached to the first surface of the (k)th rolling cycle (k)CY and the magnetic object IB attached to the second surface of the (k−1)th rolling cycle (k−1)CY may be magnetic objects. In this case, a first polarity (e.g., north pole N or south pole S) of the first magnetic object OB attached to the first surface of the (k)th rolling cycle may be exposed, and a second polarity (e.g., south pole S or north pole N) of the second magnetic object IB attached to the second surface of the (k−1)th rolling cycle may be exposed. Thus, as the rollable structure 140 is rolled, magnetic attraction may be caused between the first magnetic object OB attached to the first surface of the (k)th rolling cycle (k)CY and the second magnetic object IB attached to the second surface of the (k−1)th rolling cycle (k−1)CY. Here, as illustrated in FIGS. 9A through 9E, a shape of the first magnetic object OB attached to the first surface of the (k)th rolling cycle (k)CY and a shape of the second magnetic object IB attached to the second surface of the (k−1)th rolling cycle (k−1)CY may be variously determined.

Figure 9A:
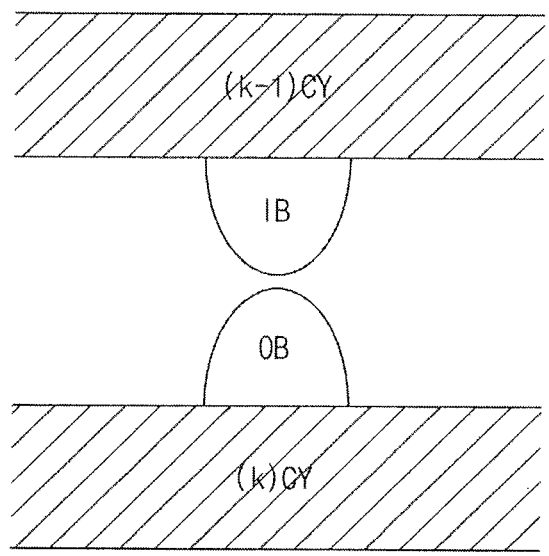
FIGS. 9A through 9E illustrate diagrams of various shapes of magnetic objects that are attached to a bezel region of a rollable structure included in the rollable display device of FIG. 1.
Figure 9B:
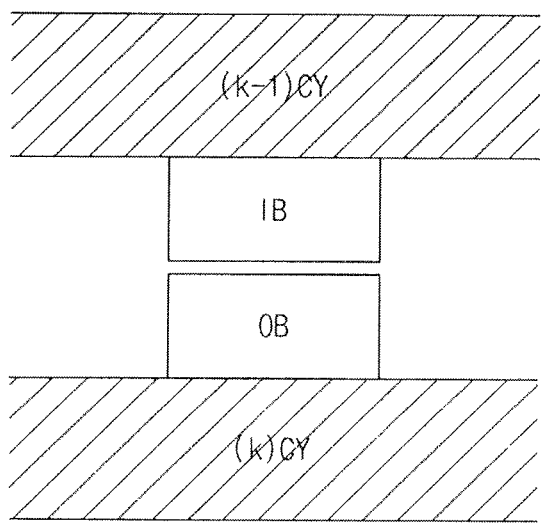

For example, in FIGS. 9A and 9B, the first magnetic object OB attached to the first surface of the (k)th rolling cycle (k)CY may have a first thickness (or, height), and the second magnetic object IB attached to the second surface of the (k−1)th rolling cycle (k−1)CY may have a second thickness. Thus, a width of a space between the (k)th rolling cycle (k)CY and the (k−1)th rolling cycle (k−1)CY may equal a sum of the first thickness and the second thickness. As a result, since the first and second magnetic objects OB and IB are coupled to each other via magnetic force upon rolling of the rollable structure 140, the space between the (k)th rolling cycle (k)CY and the (k−1)th rolling cycle (k−1)CY may be maintained constant, i.e., a sum of the first and second thicknesses, and collision between the (k)th rolling cycle (k)CY and the (k−1)th rolling cycle (k−1)CY may be prevented, e.g., due to sufficient space secured between the (k)th rolling cycle (k)CY and the (k−1)th rolling cycle (k−1)CY. As further illustrated in FIGS. 9A and 9B, the shapes of the first magnetic objects OB may be identical to those of the second magnetic objects IB, e.g., curved (FIG. 9A) or rectangular (FIG. 9B).

Figure 9C:
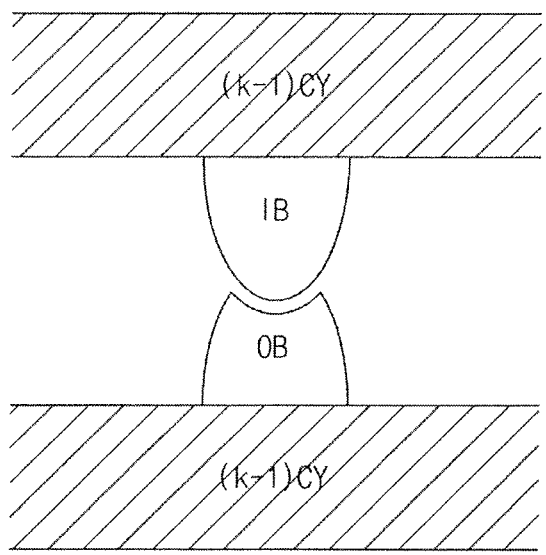
Figure 9D:
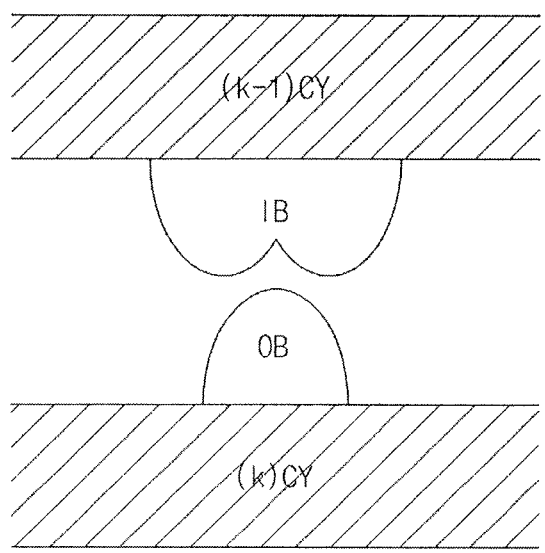
Figure 9E:
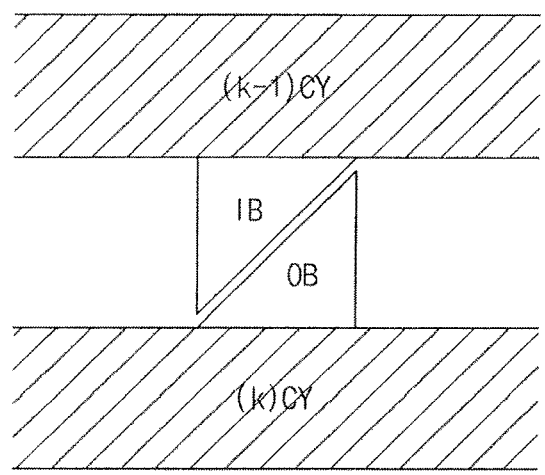

In another example, as illustrated in FIGS. 9C-9D, the shapes of the first magnetic objects OB may be complementary with respect to those of the second magnetic objects IB, so a total sum of the first and second thicknesses may still define the width of the space between the (k)th rolling cycle (k)CY and the (k−1)th rolling cycle (k−1)CY. In yet another embodiments, as illustrated in FIG. 9E, the shapes of the first magnetic objects OB may be symmetric with respect to a diagonal line extending between the (k)th rolling cycle (k)CY and the (k−1)th rolling cycle (k−1)CY.

In another example embodiment, the magnetic object IB attached to the second surface of the (k−1)th rolling cycle (k−1)CY may be a magnetic object, and the magnetic object OB attached to the first surface of the (k)th rolling cycle (k)CY may be a metal object that can stick to the magnetic object. In other words, the magnetic object IB may be attached to the second surface of the (k−1)th rolling cycle (k−1)CY, and the metal object OB may be attached to the first surface of the (k)th rolling cycle (k)CY. Thus, as the rollable structure to which the display panel structure is attached is rolled, magnetic attraction may be caused between the metal object OB attached to the first surface of the (k)th rolling cycle (k)CY and the magnetic object IB attached to the second surface of the (k−1)th rolling cycle (k−1)CY. Here, as illustrated in FIGS. 9A through 9E, a shape of the metal object OB attached to the first surface of the (k)th rolling cycle (k)CY and a shape of the magnetic object IB attached to the second surface of the (k−1)th rolling cycle (k−1)CY may be variously determined.

For example, in FIGS. 9A and 9B, the metal object OB attached to the first surface of the (k)th rolling cycle (k)CY may have a first thickness (or, height), and the magnetic object IB attached to the second surface of the (k−1)th rolling cycle (k−1)CY may have a second thickness. Thus, a space corresponding to a value generated by summing the first thickness and the second thickness may be secured between the (k)th rolling cycle (k)CY and the (k−1)th rolling cycle (k−1)CY. As a result, the collision between the (k)th rolling cycle (k)CY and the (k−1)th rolling cycle (k−1)CY may be prevented because a sufficient space is secured between the (k)th rolling cycle (k)CY and the (k−1)th rolling cycle (k−1)CY. Although various shapes of the aligners OB and IB are illustrated in FIGS. 9A through 9E, the shapes of the aligners OB and IB are not limited thereto. According to requirements for designing the rollable display device, the shapes of the aligners OB and IB may be variously determined.

Figure 10:
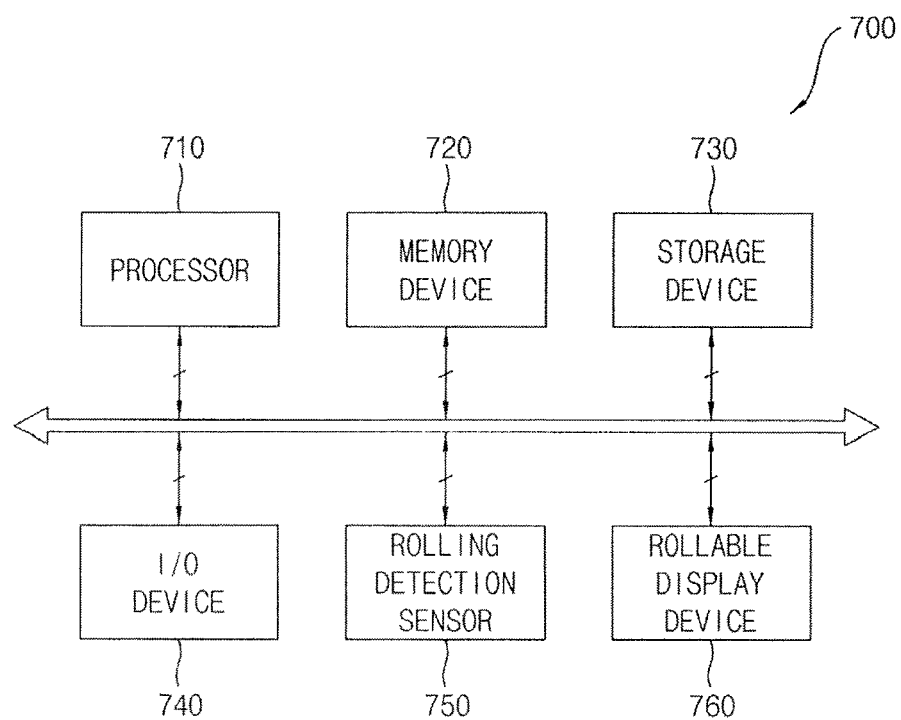
FIG. 10 illustrates a block diagram of an electronic device according to example embodiments.

FIG. 10 is a block diagram illustrating an electronic device according to example embodiments.

Referring to FIG. 10, an electronic device 700 may include a processor 710, a memory device 720, a storage device 730, an input/output (I/O) device 740, a rolling detection sensor 750, and a rollable display device 760. Here, the rollable display device 760 may be the rollable display device 100 of FIG. 1. In some example embodiments, the rollable display device 760 may be implemented by an organic light emitting display (OLED) device, a liquid crystal display (LCD) device, etc. In addition, the electronic device 700 may further include a plurality of ports for communicating with a video card, a sound card, a memory card, a universal serial bus (USB) device, other electronic devices, etc. For example, the electronic device 700 may be implemented as a cellular phone, a smart phone, a video phone, a smart pad, a smart watch, a tablet PC, a car navigation system, a television, a computer monitor, a laptop, a head mounted display (HMD) device, etc.

The processor 710 may perform various computing functions. Here, the processor 710 may control a displaying operation of the rollable display device 760 based on a rolling detection signal indicating whether the rollable display device 760 is rolled or unrolled when the rolling detection sensor 750 outputs the rolling detection signal. The processor 710 may be a micro processor, a central processing unit (CPU), an application processor (AP), etc. The processor 710 may be coupled to other components via an address bus, a control bus, a data bus, etc. Further, the processor 710 may be coupled to an extended bus such as a peripheral component interconnection (PCI) bus.

The memory device 720 may store data for operations of the electronic device 700. For example, the memory device 720 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc.

The storage device 730 may include a solid state drive (SSD) device, a hard disk drive (HDD) device, a CD-ROM device, etc. The I/O device 740 may include an input device such as a keyboard, a keypad, a mouse device, a touchpad, a touch-screen, etc. and an output device such as a printer, a speaker, etc. In some example embodiments, the electronic device 700 may further include a power supply that provides power for operations of the electronic device 700.

The rolling detection sensor 750 may generate the rolling detection signal indicating whether the rollable display device 760 is rolled or unrolled and may provide the rolling detection signal to the processor 710. Thus, the rollable display device 760 may selectively perform a displaying operation suitable for a rolled state of the rollable display device 760 and a displaying operation suitable for an unrolled state of the rollable display device 760. The rollable display device 760 may be coupled to other components via the buses or other communication links. In some example embodiments, the rollable display device 760 may be included in the I/O device 740.

As described above, the rollable display device 760 may include a display panel structure and a rollable structure to which the display panel structure is attached. The rollable structure may include a plurality of unit structures of which respective widths increase in a direction from a first side of the rollable structure to a second side of the rollable structure that is opposite to the first side of the rollable structure. Thus, the rollable structure may be rolled or unrolled based on the unit structures. Here, the rollable display device 760 may secure a sufficient space between rolling cycles, where the unit structures collectively form the rolling cycles as the rollable structure is rolled, when the rollable structure is rolled based on the unit structures included in the rollable structure. As a result, the rollable display device 760 may prevent the display panel structure attached to the rollable structure from being damaged or deteriorated by a collision between the rolling cycles. To this end, magnetic objects for securing the space between adjacent rolling cycles by causing a magnetic attraction between the adjacent rolling cycles may be attached to a bezel region of the rollable structure included in the rollable display device 760. For example, the magnetic objects may be permanent magnets or electromagnets. However, the magnetic objects are not limited thereto. In an example embodiment, the magnetic objects may be attached to all unit structures included in the rollable structure. In another example embodiment, the magnetic objects may be attached to some of the unit structures included in the rollable structure. Since the rollable display device 760 is described above, duplicated descriptions will not be repeated.

Example embodiments may be applied to a rollable display device and an electronic device including the rollable display device. For example, the rollable display device may include a rolltop display device, a bendable display device, a flexible display device, etc. For example, the electronic device may include a mobile device, e.g., a smart phone, a smart pad, a smart watch, a cellular phone, a video phone, a tablet PC, a car navigation system, a television, a computer monitor, a laptop, a head mounted display device, etc.

By way of summation and review, when a specific space is not secured between the rolling cycles, a collision between the rolling cycles may occur, and thus the display panel structure attached to the rollable structure may be damaged (e.g., scratch, crack, etc.) or deteriorated. In contrast, example embodiments provide a rollable display device capable of preventing a display panel structure attached to a rollable structure from being damaged (e.g., scratch, crack, etc.) or deteriorated by a collision between rolling cycles by securing a sufficient space between the rolling cycles when the rollable structure is rolled. Example embodiments also provide an electronic device including the rollable display device (e.g., a flexible electronic device, a rollable electronic device, etc.).

That is, a rollable display device according to example embodiments may include a display panel structure and a rollable structure to which the display panel structure is attached, may increase respective widths of unit structures included in the rollable structure in a direction from a first side of the rollable structure to a second side of the rollable structure that is opposite to the first side of the rollable structure, and may align rolling cycles, where the unit structures collectively form the rolling cycles as the rollable structure is rolled, using magnetic objects attached to a bezel region of the rollable structure when the rollable structure is rolled based on the unit structures included in the rollable structure. Thus, the rollable display device may prevent the display panel structure attached to the rollable structure from being damaged (e.g., scratch, crack, etc.) or deteriorated by a collision between the rolling cycles by securing a sufficient space between the rolling cycles when the rollable structure is rolled.

In addition, an electronic device including the rollable display device according to example embodiments may achieve durability by preventing (or, minimizing) damage or deterioration of the display panel structure included in the rollable display device while achieving portability, usability, and good design.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A rollable display device, comprising:
   a rollable structure including a plurality of unit structures, the rollable structure being rollable and unrollable based on the unit structures;
   a display panel structure attached to the rollable structure; and
   a plurality of magnetic objects on a bezel region of the rollable structure,
   wherein respective widths of the unit structures increase in a direction from a first side of the rollable structure to a second side of the rollable structure, the first side of the rollable structure being opposite to the second side of the rollable structure,
   wherein the unit structures collectively form first through (n)th rolling cycles, where n is an integer greater than or equal to 2, as the rollable structure is rolled, and a (k)th rolling cycle encircles a (k−1)th rolling cycle, where k is an integer between 2 and n,
   wherein (k)th rolling cycle unit structures of the unit structures in the (k)th rolling cycle face (k−1)th rolling cycle unit structures of the unit structures in the (k−1)th rolling cycle, wherein
   the plurality of magnetic objects cause a magnetic attraction between the (k)th rolling cycle unit structures in the (k)th rolling cycle and the (k−1)th rolling cycle unit structures in the (k−1)th rolling cycle, and wherein
   the (k)th rolling cycle unit structures and the (k−1)th rolling cycle unit structures are attached to the display panel structure.

2. The rollable display device as claimed in claim 1, wherein, when the rollable structure is rolled:
   a first surface of the (k)th rolling cycle faces a second surface of the (k−1)th rolling cycle, and
   a first polarity of first magnetic objects attached to the first surface of the (k)th rolling cycle is exposed, and a second polarity of second magnetic objects attached to the second surface of the (k−1)th rolling cycle is exposed, the first polarity being opposite to the second polarity.

3. The rollable display device as claimed in claim 2, wherein the first magnetic objects have a first thickness, the second magnetic objects have a second thickness, and a width of a space between the (k)th rolling cycle and the (k−1)th rolling cycle equals a sum of the first thickness and the second thickness.

4. The rollable display device as claimed in claim 1, wherein a first surface of the (k)th rolling cycle faces a second surface of the (k−1)th rolling cycle, the magnetic objects are attached to the second surface of the (k−1)th rolling cycle, and metal objects are attached to the first surface of the (k)th rolling cycle, the metal objects being ferromagnetic.

5. The rollable display device as claimed in claim 4, wherein the magnetic objects have a first thickness, the metal objects have a second thickness, and a width of a space between the (k)th rolling cycle and the (k−1)th rolling cycle equals a sum of the first thickness and the second thickness.

6. The rollable display device as claimed in claim 1, wherein the magnetic objects are permanent magnets.

7. The rollable display device as claimed in claim 1, wherein the magnetic objects are electromagnets.

8. The rollable display device as claimed in claim 1, wherein the magnetic objects are attached to all of the unit structures included in the rollable structure.

9. The rollable display device as claimed in claim 1, wherein the magnetic objects are attached only to some of the unit structures included in the rollable structure.

10. The rollable display device as claimed in claim 1, wherein, when the rollable structure is rolled, an angle between adjacent ones of the unit structures is maintained to be greater than or equal to a reference angle in each of the first through (n)th rolling cycles.

11. The rollable display device as claimed in claim 1, wherein the rollable structure further includes a circuit structure adjacent to the second side of the rollable structure, and a driving integrated circuit within the circuit structure to drive the display panel structure, a thickness of the circuit structure being thinner than respective thicknesses of the unit structures, and wherein
   the circuit structure is attached to outside of the rollable structure when the rolling structure is rolled.

12. An electronic device, comprising:
   a rollable display device including:
      a rollable structure including a plurality of unit structures, the rollable structure being rollable and unrollable based on the unit structures,
      a display panel structure attached to the rollable structure, and
      a plurality of magnetic objects on a bezel region of the rollable structure;
   a rolling detection sensor to generate a rolling detection signal indicating whether the rollable display device is rolled or unrolled; and
   a processor to control a displaying operation of the rollable display device based on the rolling detection signal,
   wherein respective widths of the unit structures increase in a direction from a first side of the rollable structure to a second side of the rollable structure, the first side of the rollable structure being opposite to the second side of the rollable structure,
   wherein the unit structures collectively form first through (n)th rolling cycles, where n is an integer greater than or equal to 2, as the rollable structure is rolled, and a (k)th rolling cycle encircles a (k−1)th rolling cycle, where k is an integer between 2 and n, wherein (k)th rolling cycle unit structures of the unit structures in the (k)th rolling cycle face (k−1)th rolling cycle unit structures of the unit structures in the (k−1)th rolling cycle, wherein the plurality of magnetic objects cause a magnetic attraction between the (k)th rolling cycle unit structures in the (k)th rolling cycle and the (k−1)th rolling cycle unit structures in the (k−1)th rolling cycle, and wherein the (k)th rolling cycle unit structures and the (k−1)th rolling cycle unit structures are attached to the display panel structure.

13. The electronic device as claimed in claim 12, wherein, when the rollable structure is rolled:

a first surface of the (k)th rolling cycle faces a second surface of the (k−1)th rolling cycle, and a first polarity of first magnetic objects attached to the first surface of the (k)th rolling cycle is exposed, and a second polarity of second magnetic objects attached to the second surface of the (k−1)th rolling cycle is exposed, the first polarity being opposite to the second polarity.

14. The electronic device as claimed in claim 13, wherein the first magnetic objects have a first thickness, the second magnetic objects have a second thickness, and a width of a space between the (k)th rolling cycle and the (k−1)th rolling cycle equals a sum of the first thickness and the second thickness.

15. The electronic device as claimed in claim 12, wherein a first surface of the (k)th rolling cycle faces a second surface of the (k−1)th rolling cycle, the magnetic objects are attached to the second surface of the (k−1)th rolling cycle, and metal objects are attached to the first surface of the (k)th rolling cycle, the metal objects being ferromagnetic.

16. The electronic device as claimed in claim 15, wherein the magnetic objects have a first thickness, the metal objects have a second thickness, and a width of a space between the (k)th rolling cycle and the (k−1)th rolling cycle equals a sum of the first thickness and the second thickness.

17. The electronic device as claimed in claim 12, wherein the magnetic objects are permanent magnets.

18. The electronic device as claimed in claim 12, wherein the magnetic objects are electromagnets.

19. The electronic device as claimed in claim 12, wherein the magnetic objects are attached to all of the unit structures included in the rollable structure.

20. The electronic device as claimed in claim 12, wherein the magnetic objects are attached to some of the unit structures included in the rollable structure.

* * * * *